United States Patent
Kishimura et al.

(10) Patent No.: US 6,444,395 B1
(45) Date of Patent: Sep. 3, 2002

(54) PATTERN FORMATION MATERIAL AND METHOD

(75) Inventors: Shinji Kishimura, Hyogo; Akiko Katsuyama, Kyoto; Masaru Sasago, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/523,192

(22) Filed: Mar. 10, 2000

(30) Foreign Application Priority Data

Mar. 12, 1999 (JP) .......................... 11-066225

(51) Int. Cl.$^7$ .............................. G03F 7/004
(52) U.S. Cl. .................... 430/270.1; 430/326; 430/905; 430/907; 430/909; 430/945
(58) Field of Search .............. 430/270.1, 326, 430/905, 907, 909, 945

(56) References Cited

U.S. PATENT DOCUMENTS

| 4,284,706 A | 8/1981 | Clecak et al. |
| 4,339,522 A | 7/1982 | Balanson et al. |
| 4,737,426 A | 4/1988 | Roth |
| 6,042,991 A | * 3/2000 | Aoai et al. ................ 430/285.1 |
| 6,258,507 B1 | * 7/2001 | Ochiai et al. ............ 430/270.1 |
| 6,303,266 B1 | 10/2001 | Okino et al. |

FOREIGN PATENT DOCUMENTS

| JP | 56-1933 | 1/1981 |
| JP | 56-80041 | 7/1981 |
| JP | 61-277679 | 12/1986 |
| JP | 63-127237 | 5/1988 |
| JP | 1-300248 | 12/1989 |
| JP | 2-084648 | 3/1990 |
| JP | 2-181151 | 7/1990 |

* cited by examiner

Primary Examiner—John S. Chu
(74) Attorney, Agent, or Firm—Donald R. Studebaker; Nixon Peabody LLP

(57) ABSTRACT

A resist material including a base polymer having a group for producing an active methylene group through decomposition in the presence of an acid and an acid generator for generating an acid through irradiation with light is applied on a substrate, thereby forming a resist film. The resist film is irradiated with exposing light of a wavelength of a 1 nm through 180 nm band for pattern exposure, and is developed with an alkaline developer after the pattern exposure, thereby forming a resist pattern.

20 Claims, 1 Drawing Sheet

PATTERN FORMATION MATERIAL AND METHOD

BACKGROUND OF THE INVENTION

The present invention relates to pattern formation material and method. More particularly, it relates to a pattern formation material and a pattern formation method adopted for forming a resist pattern, used for forming a semiconductor device or a semiconductor integrated circuit on a semiconductor substrate, by using light of a wavelength of a 1 nm through 180 nm band.

As exposing light used in forming a resist pattern through pattern exposure of a resist film formed on a semiconductor substrate, KrF excimer laser has been put to practical use. Also, a device including a semiconductor device or a semiconductor integrated circuit formed by using a resist pattern obtained by the pattern exposure using the KrF excimer laser is almost commercially available.

In this case, a resist material including a phenol type resin is mainly used as a resist material to be pattern-exposed with the KrF excimer laser.

For further refinement of a semiconductor device or a semiconductor integrated circuit, ArF excimer laser operating at a shorter wavelength than the KrF excimer laser is used as the exposing light. A resist material including an acrylic acid type resin is mainly under examination as a resist material used in the pattern exposure with the ArF excimer laser.

In order to realize further refinement of a semiconductor device or a semiconductor integrated circuit, however, it is necessary to use, as the exposing light, a laser beam with a wavelength shorter than that of the ArF excimer laser, such as a $Xe_2$ laser beam (with a wavelength of a 172 nm band), a $F_2$ laser beam (with a wavelength of a 157 nm band), a $Kr_2$ laser beam (with a wavelength of a 146 nm band), an ArKr laser beam (with a wavelength of a 134 nm band), an $Ar_2$ laser beam (with a wavelength of a 126 nm band) or a soft X-ray beam (with a wavelength of a 13, 11 or 5 nm band).

Therefore, the present inventors have formed a resist pattern from a resist film of a known resist material through pattern exposure using a $F_2$ laser beam.

However, the resultant resist pattern does not have a rectangular sectional shape but has a defective pattern shape.

SUMMARY OF THE INVENTION

In consideration of the aforementioned conventional problem, an object of the invention is forming a resist pattern in a good pattern shape by using light of a wavelength of a 1 nm through 180 nm band as exposing light.

The present inventors have concluded that the resist pattern has a defective pattern shape because the resist film has a high absorbing property against light of a wavelength of a 1 nm through 180 nm band, and variously studied about resist materials for decreasing the absorbing property against light of a wavelength of a 1 nm through 180 nm band. As a result, it has been found that the absorbing property of a resist film against light of a wavelength of a 1 nm through 180 nm band can be decreased when the resist material includes a group for producing an active methylene group through decomposition in the presence of an acid.

Therefore, the inventors have variously studied about a resist material including a group for producing an active methylene group through decomposition in the presence of an acid. As a result, it has been confirmed that the absorbing property against light of a wavelength of a 1 nm through 180 nm band can be decreased by using a resist material including a group for producing an active methylene group through decomposition in the presence of an acid, and found that a resist film formed from such a resist material can be definitely developed even when the concentration of an alkaline developer is low.

The present invention was devised on the basis of the aforementioned findings, and a resist material according to the invention includes a polymer or a compound having a group for producing an active methylene group through decomposition in the presence of an acid.

Specifically, the first pattern formation material of this invention comprises a base polymer including a group for producing an active methylene group through decomposition in the presence of an acid; and an acid generator for generating an acid through irradiation with light.

The first pattern formation method of this invention comprises the steps of forming a resist film by applying, on a substrate, a resist material including a base polymer having a group for producing an active methylene group through decomposition in the presence of an acid and an acid generator for generating an acid through irradiation with light; and forming a resist pattern by irradiating the resist film with exposing light of a wavelength of a 1 nm through 180 nm band for pattern exposure and developing the resist film after the pattern exposure.

In the first pattern formation material or the first pattern formation method, the base polymer includes a group for producing an active methylene group through decomposition in the presence of an acid. Therefore, the absorbing property of the resist film against light of a wavelength of a 1 nm through 180 nm band is generally decreased, resulting in increasing transmittance against the exposing light of a wavelength of a 1 nm through 180 nm band. Accordingly, a resist pattern can be formed in a good pattern shape through pattern exposure using light of a wavelength of a 1 nm through 180 nm band as the exposing light.

Furthermore, since an exposed portion of the resist film can be developed with an alkaline developer even in a low concentration, swelling of an unexposed portion of the resist film can be suppressed. As a result, resist patterns close to each other can be prevented from inclining to be further closer to each other.

The second pattern formation material of this invention comprises a base polymer soluble in an alkaline developer; a dissolution inhibiting agent, including a group for producing an active methylene group through decomposition in the presence of an acid, for inhibiting solubility of the base polymer in an alkaline developer; and an acid generator for generating an acid through irradiation with light.

The second pattern formation method of this invention comprises the steps of forming a resist film by applying, on a substrate, a resist material including a base polymer soluble in an alkaline developer, a dissolution inhibiting agent, including a group for producing an active methylene group through decomposition in the presence of an acid, for inhibiting solubility of the base polymer in an alkaline developer, and an acid generator for generating an acid through irradiation with light; and forming a resist pattern by irradiating the resist film with exposing light of a wavelength of a 1 nm through 180 nm band for pattern exposure and developing the resist film after the pattern exposure.

In the second pattern formation material or the second pattern formation method, the dissolution inhibiting agent includes a group for producing an active methylene group through decomposition in the presence of an acid. Therefore, the absorbing property of the resist film against light of a wavelength of a 1 nm through 180 nm band is generally decreased, resulting in increasing transmittance against the exposing light of a wavelength of a 1 nm through 180 nm band. Accordingly, a resist pattern can be formed in a good pattern shape through pattern exposure using light of a wavelength of a 1 nm through 180 nm band as the exposing light.

Furthermore, since an exposed portion of the resist film can be developed with an alkaline developer even in a low concentration, the swelling of an unexposed portion of the resist film can be suppressed. As a result, resist patterns close to each other can be prevented from inclining to be further closer to each other.

In the first or second pattern formation material or the first or second pattern formation method, the group for producing an active methylene group is preferably represented by General Formula 1, —CO—CH=C(OR$_1$)(OR$_2$), wherein R$_1$ and R$_2$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group.

In the case where the group for producing an active methylene group is represented by General Formula 1, when an acid (H$^+$) is generated from the acid generator through irradiation with light, the group R$_1$ is eliminated from General Formula 1 to produce an active methylene group as shown in Chemical Reaction Formula 1 below.

Chemical Reaction Formula 1

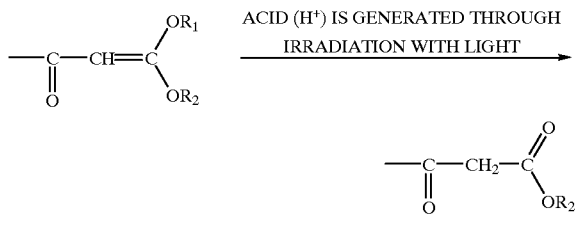

Specific examples of the group R, eliminated from General Formula 1 are t-butyl, 1-ethoxyethyl, tetrahydropyranyl, t-butyloxycarbonyl, 2-methyl-2-adamantyl and trimethylsilyl, which do not limit the invention.

In the first or second pattern formation material or the first or second pattern formation method, the group for producing an active methylene group is preferably represented by General Formula 2, —C(OR$_1$)=C=C(OR$_2$)(OR$_3$), wherein R$_1$, R$_2$ and R$_3$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group.

In the case where the group for producing an active methylene group is represented by General Formula 2, when an acid (H$^+$) is generated from the acid generator through irradiation with light, the groups R$_1$ and R$_2$ are eliminated from General Formula 2 to produce an active methylene group as shown in Chemical Reaction Formula 2 below.

Chemical Reaction Formula 2:

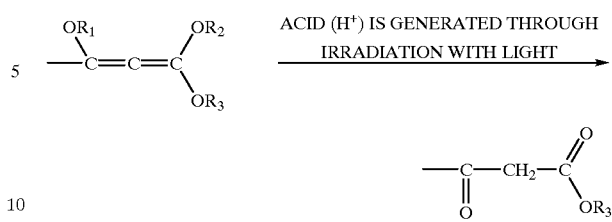

The specific examples of the groups R$_1$ and R$_2$ eliminated from General Formula 2 are t-butyl, 1-ethoxyethyl, tetrahydropyranyl, t-butyloxycarbonyl, 2-methyl-2-adamantyl and trimethylsilyl, which do not limit the invention.

In the second pattern formation material or method, specific examples of the base polymer are an acrylic type resin, a styrene type resin, a novolak resin and a polyolefin type resin, which do not limit the invention.

DETAILED DESCRIPTION OF THE INVENTION

Embodiment 1

Embodiment 1 of the invention will now be described with reference to FIGS. 1(a) through 1(d). In Embodiment 1, a resist pattern is formed by using a pattern formation material including a base polymer having a group for producing an active methylene group through decomposition in the presence of an acid and an acid generator for generating an acid through irradiation with light. The specific composition of the resist material used in this embodiment is as follows:

Base polymer:

| | |
|---|---|
| a polymer represented by Chemical Formula 1 | 2 g |
| Acid generator: triphenylsulfonium triflate | 0.04 g |
| Solvent: diglyme | 20 g |

Chemical Formula 1

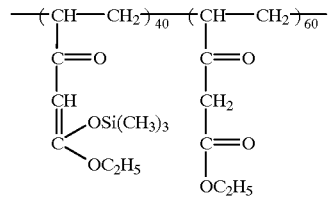

Figure 1A:
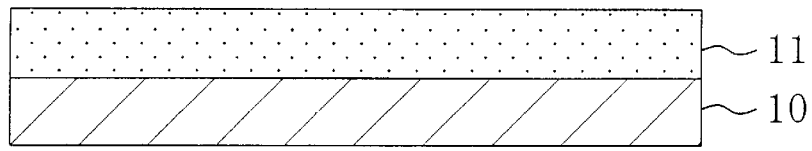
FIGS. 1(a) through 1(d) are sectional views for showing procedures in a pattern formation method according to Embodiment 1 or 2 of the invention.

First, as is shown in FIG. 1(a), the resist material having the aforementioned composition is applied by spin coating on a semiconductor substrate 10, thereby forming a resist film 11 with a thickness of 0.3 μm.

Figure 1B:
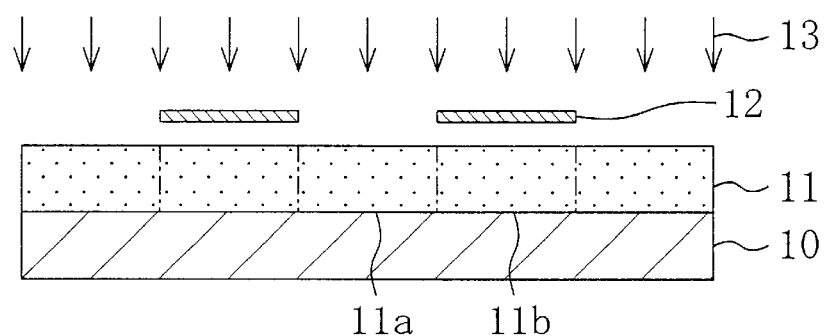

Next, as is shown in FIG. 1(b), the resist film 11 is irradiated with a F$_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Figure 1C:
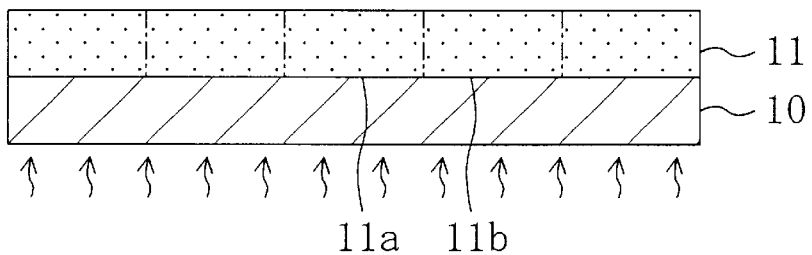

Then, as is shown in FIG. 1(c), the semiconductor substrate 10 together with the resist film 11 are heated with a hot plate at 100° C. for 60 seconds. Although the base polymer is alkali-refractory, it decomposes when heated in the presence of an acid, and hence, the exposed portion 11a of the resist film 11 becomes soluble in an alkaline developer. In this case, the base polymer produces an active methylene group through the decomposition.

Figure 1D:
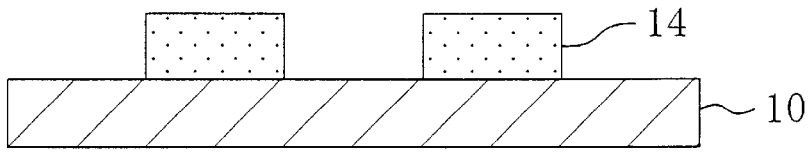

Thereafter, the resist film 11 is developed with an alkaline developer, such as a 2.38 wt % tetramethylammonium hydroxide developer. Since the exposed portion 11a of the resist film 11 is dissolved in the developer, the unexposed portion 11b of the resist film 11 is formed into a resist pattern 14 as is shown in FIG. 1(d).

In Embodiment 1, the polymer represented by Chemical Formula 1, namely, the polymer that produces an active methylene group through decomposition, has a lower absorbing property against the $F_2$ laser beam 13 as compared with a polymer for producing carboxylic acid or a hydroxyl group through decomposition. Therefore, the polymer has high transmittance against the exposing light of a wavelength of a 1 nm through 180 nm band, and hence, the exposing light can sufficiently reach the bottom of the resist film 11. As a result, the resist pattern 14 can be formed in a good sectional shape with a line width of 0.08 μm.

Although the 2.38 wt % developer is used for development in Embodiment 1, the development can be definitely conducted by using a 0.24 wt % developer instead. When a developer in such a low concentration is used for the development, swelling of the unexposed portion 11b of the resist film 11 can be suppressed(namely, the unexposed portion 11b of the resist film 11 is more largely swelled when a developer in a higher concentration is used). As a result, in the resist patterns 14 close to each other, the upper portions thereof can be prevented from inclining to be further closer to each other.

Also, a resist pattern can be formed in a good sectional shape when any of polymers respectively represented by Chemical Formulas 2 through 6 below is used instead of the polymer represented by Chemical Formula 1 as the alkali-refractory base polymer in Embodiment 1.

Chemical Formula 2

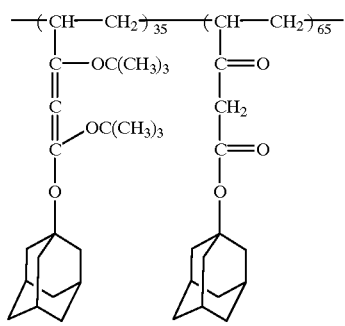

Chemical Formula 3

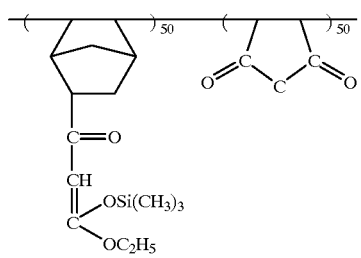

Chemical Formula 4

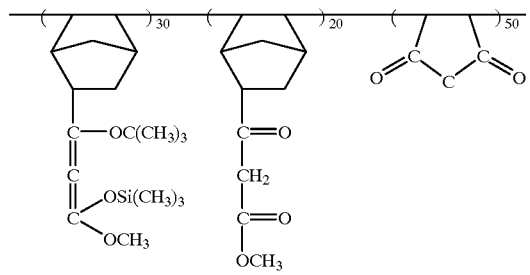

Chemical Formula 5

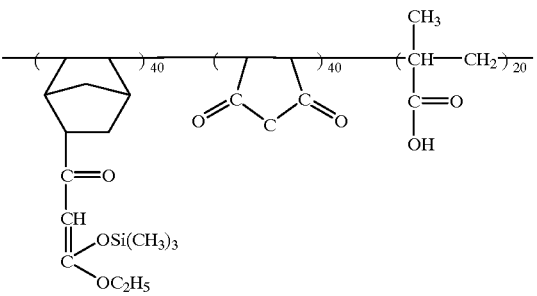

Chemical Formula 6

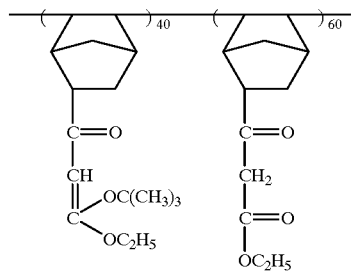

Embodiment 2

Embodiment 2 of the invention will now be described with reference to FIGS. 1(a) through 1(d). In Embodiment 2, a resist pattern is formed by using a pattern formation material including an alkali-soluble base polymer; a dissolution inhibiting agent for inhibiting the alkali-solubility of the base polymer and producing an active methylene group through decomposition in the presence of an acid; and an acid generator for generating an acid through irradiation with light.

The specific composition of the resist material used in this embodiment is as follows:

Base polymer:

| | |
|---|---|
| poly (vinyl phenol) (styrene type resin) | 2 g |
| Dissolution inhibiting agent: | 0.4 g |
| a compound represented by Chemical Formula 7 | |
| Acid generator: triphenylsulfonium triflate | 0.04 g |
| Solvent: diglyme | 20 g |

Chemical Formula 7

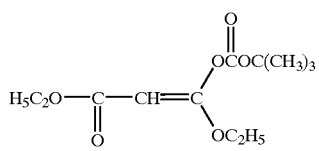

First, as is shown in FIG. 1(a), the resist material having the aforementioned composition is applied by spin coating on a semiconductor substrate 10, thereby forming a resist film 11 with a thickness of 0.3 μm.

Next, as is shown in FIG. 1(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Although the base polymer is alkali-soluble, the resist film 11 is alkali-refractory due to the function of the dissolution inhibiting agent. When the semiconductor substrate 10 together with the resist film 11 are heated with a hot plate at 100° C. for 60 seconds as is shown in FIG. 1(c), the dissolution inhibiting agent decomposes to give an active methylene group and loses the property to inhibit the dissolution of the base polymer. Accordingly, the exposed portion 11a of the resist film 11 becomes alkali-soluble.

Thereafter, the resist film 11 is developed with an alkaline developer, such as a 2.38 wt % tetramethylammonium hydroxide developer. Since the exposed portion 11a of the resist film 11 is dissolved in the developer, the unexposed portion 11b of the resist film 11 is formed into a resist pattern 14 as is shown in FIG. 1(d).

In Embodiment 2, the polymer represented by Chemical Formula 7, namely, the compound that produces an active methylene group through decomposition, has a low absorbing property against the $F_2$ laser beam 13. Therefore, the compound has high transmittance against the exposing light of a wavelength of a 1 nm through 180 nm band, and hence, the exposing light can sufficiently reach the bottom of the resist film 11. As a result, the resist pattern 14 can be formed in a good sectional shape with a line width of 0.08 μm.

Although the 2.38 wt % developer is used for development in Embodiment 2, the development can be definitely conducted by using a 0.24 wt % developer instead. When a developer in such a low concentration is used for the development, swelling of the unexposed portion 11b of the resist film 11 can be suppressed. As a result, in the resist patterns 14 close to each other, the upper portions thereof can be prevented from inclining to be further closer to each other.

Modification 1 of Embodiment 2

Modification 1 of Embodiment 2 is different from Embodiment 2 in the resist material alone, and hence, the resist material alone will be herein described.

| | |
|---|---|
| Base polymer: novolak resin | 2 g |
| Dissolution inhibiting agent: | 0.3 g |
| a compound represented by Chemical Formula 8 | |
| Acid generator: triphenylsulfonium triflate | 0.04 g |
| Solvent: diglyme | 20 g |

Chemical Formula 8

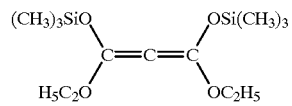

Modification 2 of Embodiment 2

Modification 2 of Embodiment 2 is different from Embodiment 2 in the resist material alone, and hence, the resist material alone will be herein described.

| | |
|---|---|
| Base polymer: | 2 g |
| a polymer represented by Chemical Formula 9 | |
| (polyolefin type resin) | |
| Dissolution inhibiting agent: | 0.5 g |
| a compound represented by Chemical Formula 10 | |
| Acid generator: triphenylsulfonium triflate | 0.04 g |
| Solvent: diglyme | 20 g |

Chemical Formula 9

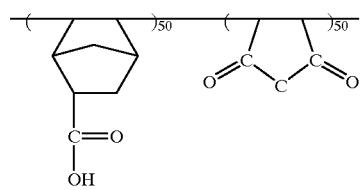

Chemical Formula 10

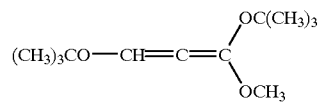

The compound represented by Chemical Formula 10 used as the dissolution inhibiting agent can be replaced with a compound represented by Chemical Formula 11.

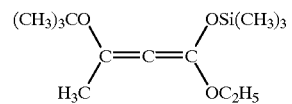

The polyolefin type resin represented by Chemical Formula 9 used as the alkali-soluble base polymer can be replaced with a polyolefin type resin represented by Chemical Formula 12 or an acrylic type resin.

Chemical Formula 12

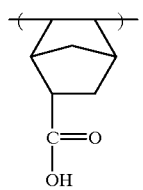

In Embodiments 1 and 2, the compounds represented by Chemical Formulas 1, 3, 5, 6 and 7 are specific examples of a compound including a group represented by General Formula, $—CO—CH=C(OR_1)(OR_2)$ (wherein $R_1$ and $R_2$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group). In the compound of Chemical Formula 1, $R_1$ or $R_2$ is a silyl group or a saturated alkyl group; in the compound of Chemical Formula 3, $R_1$ or $R_2$ is a silyl group or a saturated alkyl group; in the compound of Chemical Formula 5, $R_1$ or $R_2$ is a silyl group or a saturated alkyl group; in the compound of Chemical Formula 6, $R_1$ or $R_2$ is a saturated alkyl group; and in the compound of Chemical Formula 7, $R_1$ or $R_2$ is a saturated alkyl group.

Furthermore, in Embodiments 1 and 2, the compounds represented by Chemical Formulas 2, 4, 8, 10 and 11 are specific examples of a compound including a group represented by General Formula, $—C(OR_1)=C=C(OR_2)(OR_3)$ (wherein $R_1$, $R_2$ and $R_3$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group). In this case, in the compound of Chemical Formula 2, $R_1$, $R_2$ or $R_3$ is a saturated alkyl group or a cyclic saturated alkyl group; in the compound of Chemical Formula 4, $R_1$, $R_2$ or $R_3$ is a silyl group or a saturated alkyl group; in the compound of Chemical Formula 8, $R_1$, $R_2$ or $R_3$ is a silyl group or a saturated alkyl group; in the compound of Chemical Formula 10, $R_1$, $R_2$ or $R_3$ is a saturated alkyl group; and in the compound of Chemical Formula 11, $R_1$ is a saturated alkyl group and $R_2$ or $R_3$ is a silyl group or a saturated alkyl group.

Also in Embodiments 1 and 2, although the $F_2$ laser beam is used as the exposing light, a $Xe_2$ laser beam (with a wavelength of a 172 nm band), a $Kr_2$ laser beam (with a wavelength of a 146 nm band), an ArKr laser beam (with a wavelength of a 134 nm band), an $Ar_2$ laser beam (with a wavelength of a 126 nm band) or a soft X-ray beam (with a wavelength of a 13, 11 or 5 nm band) can be used instead.

What is claimed is:

1. A pattern formation material comprising:
a base polymer including a group for producing an active methylene group through decomposition in the presence of an acid; and
an acid generator for generating an acid through irradiation with light;
wherein said group for producing an active methylene group is represented by a general formula, $—CO—CH=C(OR_1)(OR_2)$, wherein $R_1$ and $R_2$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group.

2. A pattern formation material comprising:
a base polymer including a group for producing an active methylene group through decomposition in the presence of an acid; and
an acid generator for generating an acid through irradiation with light;
wherein said group for producing an active methylene group is represented by a general formula, $—C(OR_1)=C=C(OR_2)(OR_3)$, wherein $R_1$, $R_2$, and $R_3$, are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group.

3. A pattern formation material comprising:
a base polymer having alkali-solubility;
a dissolution inhibiting agent for inhibiting the alkali-solubility of said base polymer and producing an active methylene group through decomposition in the presence of an acid; and
an acid generator for generating an acid through irradiation with light;
wherein said group for producing an active methylene group is represented by a general formula, $—CO—CH=C(OR_1)(OR_2)$, wherein $R_1$ and $R_2$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group.

4. A pattern formation material comprising:
a base polymer having alkali-solubility;
a dissolution inhibiting agent for inhibiting the alkali-solubility of said base polymer and producing an active methylene group through decomposition in the presence of an acid; and
an acid generator for generating an acid through irradiation with light;
wherein said group for producing an active methylene group is represented by a general formula, $—C(OR_1)=C=C(OR_2)(OR_3)$, wherein $R_1$, $R_2$ and $R_3$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group.

5. The pattern formation material of claim 3,
wherein said base polymer is an acrylic type resin, a styrene type resin, a novolak resin or a polyolefin type resin.

6. A pattern formation method comprising the steps of:
forming a resist film by applying, on a substrate, a resist material including a base polymer having a group for producing an active methylene group through decomposition in the presence of an acid and an acid generator for generating an acid through irradiation with light; and
forming a resist pattern by irradiating said resist film with exposing light of a wavelength of a 1 nm through 180 nm band for pattern exposure and developing said resist film with an alkaline developer after the pattern exposure;
wherein said group for producing an active methylene group is represented by a general formula, $—CO—$ CH=C(OR$_1$)(OR$_2$), wherein R$_1$ and R$_2$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group.

7. A pattern formation method comprising the steps of:

forming a resist film by applying, on a substrate, a resist material including a base polymer having a group for producing an active methylene group through decomposition in the presence of an acid and an acid generator for generating an acid through irradiation with light; and forming a resist pattern by irradiating said resist film with exposing light of a wavelength of a 1 nm through 180 nm band for pattern exposure and developing said resist film with an alkaline developer after the pattern exposure;

wherein said group for producing an active methylene group is represented by a general formula, —C(OR$_1$)=C=C(OR$_2$)(OR$_3$), wherein R$_1$, R$_2$ and R$_3$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group.

8. A pattern formation method comprising the steps of:

forming a resist film by applying, on a substrate, a resist material including a base polymer having alkali-solubility, a dissolution inhibiting agent for inhibiting the alkali-solubility of said base polymer and producing an active methylene group through decomposition in the presence of an acid and an acid generator for generating an acid through irradiation with light; and forming a resist pattern by irradiating said resist film with exposing light of a wavelength of a 1 nm through 180 nm band for pattern exposure and developing said resist film with an alkaline developer after the pattern exposure;

wherein said group for producing an active methylene group is represented by a general formula, —CO—CH=C(OR$_1$)(OR$_2$), wherein R$_1$ and R$_2$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group.

9. A pattern formation method comprising the steps of:

forming a resist film by applying, on a substrate, a resist material including a base polymer having alkali-solubility, a dissolution inhibiting agent for inhibiting the alkali-solubility of said base polymer and producing an active methylene group through decomposition in the presence of an acid and an acid generator for generating an acid through irradiation with light; and forming a resist pattern by irradiating said resist film with exposing light of a wavelength of a 1 nm through 180 nm band for pattern exposure and developing said resist film with an alkaline developer after the pattern exposure;

wherein said group for producing an active methylene group is represented by a general formula, —C(OR,)=C=C(OR$_2$)(OR$_3$), wherein R$_1$, R$_2$ and R$_3$ are the same or different substituent or non-substituted groups selected from the group consisting of a saturated alkyl group, an unsaturated alkyl group, a cyclic saturated alkyl group, a cyclic unsaturated alkyl group, a silyl group and a carbonyl group.

10. The pattern formation method of claim 8, wherein said base polymer is an acrylic type resin, a styrene type resin, a novolak resin or a polyolefin type resin.

11. The pattern formation material of claim 4, wherein said base polymer is an acrylic type resin, a styrene type resin, a novolak resin or a polyolefin type resin.

12. The pattern formation material of claim 9, wherein said base polymer is an acrylic type resin, a styrene type resin, a novolak resin or a polyolefin type resin.

13. The pattern formation method of claim 8, wherein said exposing light is an Xe$_2$ laser beam, a F$_2$ laser beam, a Kr$_2$ laser beam, an ArKr laser beam or an Ar$_2$ laser beam.

14. The pattern formation method of claim 8, wherein said exposing light is a soft X-ray beam.

15. The pattern formation method of claim 9, wherein said exposing light is an Xe$_2$ laser beam, a F$_2$ laser beam, a Kr$_2$ laser beam, an ArKr laser beam or an Ar$_2$ laser beam.

16. The pattern formation method of claim 9, wherein said exposing light is a soft X-ray beam.

17. The pattern formation method of claim 6, wherein said exposing light is an Xe$_2$ laser beam, a F$_2$ laser beam, a Kr$_2$ laser beam, an ArKr laser beam or an Ar$_2$ laser beam.

18. The pattern formation method of claim 6, wherein said exposing light is a soft X-ray beam.

19. The pattern formation method of claim 7, wherein said exposing light is an Xe$_2$ laser beam, a F$_2$ laser beam, a Kr$_2$ laser beam, an ArKr laser beam or an Ar$_2$ laser beam.

20. The pattern formation method of claim 7, wherein said exposing light is a soft X-ray beam.

* * * * *